(12) United States Patent
Beier

(10) Patent No.: US 6,822,668 B2
(45) Date of Patent: Nov. 23, 2004

(54) MULTIBEAM LASER LIGHT SOURCE WITH VARIABLE LIGHT SOURCE SPACING FOR SETTING IMAGES ON PRINTING FORMS

(75) Inventor: Bernard Beier, Ladenburg (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 27 days.

(21) Appl. No.: 10/245,620

(22) Filed: Sep. 17, 2002

(65) Prior Publication Data

US 2003/0058898 A1 Mar. 27, 2003

(30) Foreign Application Priority Data

Sep. 17, 2001 (DE) .......................................... 101 45 705

(51) Int. Cl.[7] .................................................. B41J 2/45
(52) U.S. Cl. ...................................................... 347/238
(58) Field of Search ................................ 347/130, 137, 347/238, 244, 237, 247, 253; 250/338.4; 372/70, 71, 72, 75, 92

(56) References Cited

U.S. PATENT DOCUMENTS

| | | | |
|---|---|---|---|
| 4,217,561 A | 8/1980 | Scifres et al. .................. | 372/24 |
| 4,719,623 A | 1/1988 | Leyser ......................... | 370/509 |
| 4,719,632 A | 1/1988 | Lindsey et al. ................ | 372/50 |
| 4,791,646 A | 12/1988 | Lindsey et al. ................ | 372/44 |
| 4,901,330 A * | 2/1990 | Wolfram et al. ............... | 372/75 |
| 5,627,853 A * | 5/1997 | Mooradian et al. ............ | 372/92 |
| 5,713,287 A | 2/1998 | Gelbart ........................ | 101/467 |
| 5,781,576 A | 7/1998 | Kimura et al. ................. | 372/45 |
| 6,072,518 A | 6/2000 | Gelbart ........................ | 347/239 |
| 6,346,961 B1 | 2/2002 | Schmid ........................ | 347/241 |

FOREIGN PATENT DOCUMENTS

| | | |
|---|---|---|
| DE | 196 12 927 A1 | 11/1996 |
| DE | 100 13 454 A1 | 10/2000 |
| DE | 199 53 144 A1 | 5/2001 |
| DE | 100 10 619 A1 | 9/2001 |
| EP | 0 227 426 A2 | 7/1987 |

OTHER PUBLICATIONS

Karl Joachim Ebeling: "Integrierte Optoelektronik" [integrated optoelectronics], *Springer Verlag, Berlin, 2nd. Ed.*, 1992, pp. 322–326.

* cited by examiner

*Primary Examiner*—Hai Pham
(74) *Attorney, Agent, or Firm*—Laurence A. Greenberg; Werner H. Stemer; Ralph E. Locher

(57) ABSTRACT

A multibeam laser light source, comprising a plurality of individual laser light sources arranged in an array and including a first and a second laser light source for emitting respective light beams spaced from one another, said first laser light source having a resonator with a given pump energy distribution therethrough, the spacing of the light beam emitted by said first laser light source from the light beam emitted by said second laser light source being variable by varying said given pump energy distribution through said resonator of said first laser light source; an image-setting or imaging device therewith; a printing form exposer with the imaging device combination; a printing unit with the imaging device combination; and a printing press with the printing unit combination.

20 Claims, 3 Drawing Sheets

MULTIBEAM LASER LIGHT SOURCE WITH VARIABLE LIGHT SOURCE SPACING FOR SETTING IMAGES ON PRINTING FORMS

BACKGROUND OF THE INVENTION

FIELD OF THE INVENTION

The invention relates to a multibeam laser source with a plurality of laser light sources arranged in an array.

To set images on image carriers formed with a flat or curved surface, in particular printing forms in a printing form exposer or a direct imaging printing unit of a printing machine, use is frequently made of multibeam light sources, typically multibeam laser light sources, such as semiconductor laser or diode laser arrays, in particular. Depending upon the image information to be set, each individual light source and each individual emitter is switched on or the variables that influence the light intensity for each image point to be set on the image carrier is set or prescribed, respectively, so that each individual emitter produces a projection point with a specific light intensity. As an option, provision is frequently also made of imaging or reproduction optics for projecting the light emitted by the light sources onto the image carrier, frequently by changing the propagation direction of the light and by beam shaping, respectively.

For precise and simple image-setting or imaging of the printing form by the plurality of heretoforeknown imaging methods, it is desirable that the image points of the light sources on the image carrier lie on one projection line for the one-dimensional case, preferably on a straight line, which typically, if the image carrier is a printing form and is accommodated on a so-called printing form cylinder or printing plate cylinder, is parallel to the axis of the cylinder and, for the two-dimensional case, forms an orthogonal, in particular Cartesian projection field, respectively. Furthermore, it is particularly advantageous if the spacings between adjacent image points are uniform. Due to influences or effects arising during manufacture, the spacings of the light sources from one another frequently do not meet these requirements. Possible causes therefor are position errors of individual emitters on a substrate or a change in the geometry during fastening to a holding element, for example. In addition, reproduction or imaging errors in the reproduction or imaging optics arranged downstream to project the light sources onto image points in a projection plane often lead to deviations in the spacings from desired prescriptions thereof.

While the use of micro-optical components in reproducing or imaging optics, i.e., individual optical components which, respectively, act upon a light beam originating from only one emitter or from a few emitters, in principle, permits the light path or the course of the beam to be varied, in particular in relation to another beam from another emitter or several other emitters, there exist technical reasons which hamper a practicable realization of this concept, amongst others due to the small geometric dimensions of the micro-optical components or of the lack of a permanent fixing.

Because, in general, the image carrier upon which an image is to be set is movable relative to the image-setting or imaging device with the multibeam light source, there is a further possible way of varying the position of image points to be set on the image carrier located in the projection plane, in that the time control of the individual light sources in the multibeam light source is selected to be different so that the projection points of the light sources come to lie at desired coordinate points on the image carrier. In this way, for example with a number of light sources distributed non-uniformly in the direction of the relative movement, a number of image points distributed uniformly in this direction or distributed as desired can be produced. In the non-prepublished German Patent Application No. De 101 24 215.8 known only in-house at the corporate assignee of the instant application, an image-setting or imaging device of this general type with a plurality of light sources is described, to which a time delay device is assigned, which shifts the triggering point for driving each light source as a function of the respective spacing of the light source from a subject line in such a way that image points are produced in a projection line of the subject line on a printing form.

Electronic correction of the position of the image point by time-delayed control, using the movement of the image carrier with respect to the image-setting or imaging device, is, however, possible for a number of projection points only in the sense that a one-dimensional arrangement on the surface of the image carrier is achieved; for a multibeam light source, the light sources of which are arranged in a one-dimensional array, only a (one-dimensional) curve or else a straight or sectionally straight line can be predefined or prescribed on the (two-dimensional) surface of the image carrier. Time-delayed driving or control of the light sources takes place in such a way that triggering of the light source occurs when, during the relative movement between the image-setting or imaging device and the image carrier, the assigned projection point thereof intersects the curve on the surface. Accordingly, the image point that is produced lies on the curve. In general, with the hereinaforementioned procedure, however, it is not possible, for fundamental reasons, to influence the position of the image points produced along the curve, because, in the geometric sense, this is a (one-dimensional) projection of the position of the projection points on the surface onto the curve for non-delayed driving or control of the light sources along the direction of the relative movement. What is involved, therefore, is an only one-dimensional correction of the image point position. For a multibeam laser light source with light sources arranged in a two-dimensional array, this property therefore applies correspondingly to each line in the arrangement.

As is known, the radiation characteristic of a laser light source is influenced by the geometric arrangement of the resonator. An introduction to laser structures of semiconductor lasers is given, for example, in "Integrierte Optoelektronik" (Integrated Opto-electronics) by K. J. Ebeling (Springer, Heidelberg, 1992). Furthermore, particularly for gain-guided laser diodes, it is known that the active region wherein laser activity occurs is determined by the region through which current flows, i.e., that region wherein pump energy is provided.

U.S. Pat. No. 4,791,646 discloses that a gain-guided diode laser can have a spatial distribution of the pump energy in the resonator, so to say, a tailor-made pump energy distribution. This is achieved by a two-dimensional pattern of current-guiding contacts and insulating regions on one side of the laser. The location-dependent pumping within the resonator of a large-area diode laser leads to a narrow intensity distribution in the remote field.

U.S. Pat. No. 4,719,623 describes a gain-guided diode laser with a spatial pump energy distribution, which has a nonuniform pattern of current-carrying contacts and insulating regions on one side of the laser. Although the laser is described as a field with a plurality of partial lasers, what is involved is a single-beam light source, because the individual partial lasers are coupled. Due to the feature of a nonuniform pump current distribution, oscillation of the laser in the fundamental super mode of the coupled partial lasers formed by the individual pump currents is promoted, so that a spatially narrow remote field is generated.

The aforedescribed gain-guided diode lasers are single-beam laser light sources. Although, with the aforedescribed measures, an effect upon the intensity distribution of the remote field of the diode lasers is achieved, no lateral beam offset in a direction perpendicularly to the emission direction of the resonator can be achieved. However, this property is desirable in particular for the use of a multibeam laser light source for setting an image on an image carrier, in particular for the efficient setting of an image on a printing form in a printing form exposer or a direct imaging printing unit of a printing machine.

SUMMARY OF THE INVENTION

It is accordingly an object of the invention to provide a multibeam laser light source, particularly for a device for setting images on image carriers, which emits a plurality of light beams having projection points on a projection surface which exhibit a variable spacing from one another.

With the foregoing and other objects in view, there is provided, in accordance with one aspect of the invention, a multibeam laser light source, comprising a plurality of individual laser light sources arranged in an array and including a first and a second laser light source for emitting respective light beams spaced from one another, the first laser light source having a resonator with a given pump energy distribution therethrough, the spacing of the light beam emitted by the first laser light source from the light beam emitted by the second laser light source being variable by varying the given pump energy distribution through the resonator of the first laser light source.

In accordance with another feature of the invention, wherein the variation in the pump energy distribution is performable in at least one of two Cartesian spatial directions, at least approximately perpendicularly to an optical axis of the resonator.

In accordance with a further feature of the invention, the individual laser light sources are individually controllable.

In accordance with an added feature of the invention, the individual laser light sources are semiconductor lasers.

In accordance with an additional feature of the invention, the semiconductor lasers are gain-guided laser diodes.

In accordance with yet another feature of the invention, at least the first laser light source has a plurality of mutually insulated contacts for injecting current into the resonator.

In accordance with yet a further feature of the invention, the mutually insulated contacts are tracks extending at least approximately parallel to an optical axis of the resonator.

In accordance with yet an added feature of the invention, the mutually insulated contacts have an at least approximately uniform spacing from one another.

In accordance with yet an additional feature of the invention, the individual laser light sources are arranged on a substrate.

In accordance with still another feature of the invention, the individual laser light sources are located on a laser diode bar.

In accordance with still a further feature of the invention, the individual laser light sources are arranged in an array selected from the group thereof consisting of an at least approximately uniform and an at least approximately Cartesian array.

In accordance with still an added feature of the invention, the individual laser light sources are arranged at least approximately on a line.

In accordance with still an additional feature of the invention, the individual laser light sources are arranged at least on an approximately straight line.

In accordance with another feature of the invention, the multibeam laser light source further has a control unit assigned thereto, the control unit serving for controlling at least one of timed driving of the individual laser light sources and variation of pump energy distributions in the resonators of the respective individual laser light sources.

In accordance with a further feature of the invention, the multibeam laser light source further comprises a measuring device assigned to at least the first laser light source for distribution of the light emitted by the first laser light source, at least in one of two spatial directions perpendicular to an optical axis of the resonator.

In accordance with another aspect of the invention, there is provided an image-setting or imaging device for an image carrier, including a multibeam laser light source, comprising a plurality of individual laser light sources arranged in an array and including a first and a second laser light source for emitting respective light beams spaced from one another, the first laser light source having a resonator with a given pump energy distribution therethrough, the spacing of the light beam emitted by the first laser light source from the light beam emitted by the second laser light source being variable by varying the given pump energy distribution through the resonator of the first laser light source.

In accordance with a further feature of the invention, the image-setting device further comprises imaging optics having micro-optical components.

In accordance with an added aspect of the invention, there is provided a printing form exposer, including an image-setting or imaging device for an image carrier, having a multibeam laser light source, comprising a plurality of individual laser light sources arranged in an array and including a first and a second laser light source for emitting respective light beams spaced from one another, the first laser light source having a resonator with a given pump energy distribution therethrough, the spacing of the light beam emitted by the first laser light source from the light beam emitted by the second laser light source being variable by varying the given pump energy distribution through the resonator of the first laser light source.

In accordance with an additional aspect of the invention, there is provided a printing unit, including an image-setting or imaging device for an image carrier, having a multibeam laser light source, comprising a plurality of individual laser light sources arranged in an array and including a first and a second laser light source for emitting respective light beams spaced from one another, the first laser light source having a resonator with a given pump energy distribution therethrough, the spacing of the light beam emitted by the first laser light source from the light beam emitted by the second laser light source being variable by varying the given pump energy distribution through the resonator of the first laser light source.

In accordance with a concomitant feature of the invention, there is provided a printing press, provided with a printing unit, including an image-setting or imaging device for an image carrier, having a multibeam laser light source, comprising a plurality of individual laser light sources arranged in an array and including a first and a second laser light source for emitting respective light beams spaced from one another, the first laser light source having a resonator with a given pump energy distribution therethrough, the spacing of the light beam emitted by the first laser light source from the light beam emitted by the second laser light source being variable by varying the given pump energy distribution through the resonator of the first laser light source.

According to the invention, the multibeam laser light source with a plurality of individual laser light sources which are arranged in an array is distinguished by the fact that the spacing of the light beam emitted by a first laser light source of the plurality of laser light sources from a light beam emitted by a second laser light source of the plurality of laser light sources can be varied by varying the pump energy distribution through the resonator of the first laser light source. Herein, the arrangement in an array is to be understood to be that the laser light sources at least approximately all lie in a two-dimensional surface or on a one-dimensional curve. The spacing of the light beams from one another is to be understood in this connection as the spacing of the optical axis of the first laser light source from the optical axis of the second light source, measured at a comparable point, for example on the exit surfaces of the light or facets of the resonators of the laser light sources. The laser light sources are preferably arranged in the array in such a way that at least approximately parallel emission of the laser light beams in relation to one another occurs. Furthermore, it is preferable that varying the pump energy distribution can be performed for each of the plurality of individual laser light sources. The individual laser light sources can preferably be driven individually. Expressed in other words, the individual laser light sources of the multibeam laser light source can be single-beam laser light sources which are independent of one another.

In a preferred embodiment of the invention, the variation in the pump energy distribution is carried out in at least one of the two Cartesian spatial directions, at least approximately perpendicularly to the optical axis of the resonator. Furthermore, the pump energy distribution along the optical axis, at least on a section of the resonator, can be at least approximately independent of the distance from the exit mirror or from the exit surface of the light from the resonator.

It is particularly advantageously possible, in the multibeam laser light source according to the invention, to correct a pitch error, i.e., a deviation which, for example, is caused by production or manufacture, of the actual position of the optical axes of the individual laser light sources in the array, predefined or prescribed by the geometry of the laser, from a desired or required position, by carrying out a shift in the active region of one or more laser light sources at least approximately perpendicularly to the emission direction defined by the optical axis.

The individual laser light sources are preferably embodied as semiconductor lasers, in particular gain-guided laser diodes. At least the first laser light source of the plurality of laser light sources, preferably each of the individual laser light sources, has a plurality of mutually insulated contacts for injecting current into the resonator. The number of laser light sources is independent of the number of mutually insulated contacts. In particular, the mutually insulated contacts are tracks which extend at least approximately parallel to the optical axis of the resonator. A shift of the active region of one or more individual laser light sources at least approximately perpendicularly to the emission direction defined by the optical axis can then be achieved by varying the driving or controlling of the contacts. The mutually insulated contacts can have an at least approximately uniform spacing from one another.

In an advantageous development of the invention, the individual laser light sources of the multibeam laser light source are arranged on a substrate. Therefore, expressed in other words, the multibeam laser light source can be in particular a laser diode array or a laser diode bar. It can be used in continuous operation or in pulsed operation.

It is particularly advantageous if the individual laser light sources of the multibeam laser light source are arranged in an at least approximately uniform and/or at least approximately Cartesian array. Typically, the laser light sources can be arranged at least approximately on a line, in particular on a straight line. By such regular arrangements, use in an image-setting or imaging device is made considerably easier, because then the assignment of the image data of the individual image points to the image-setting channels formed by the light beams, by the so-called image-setting or imaging beams, satisfies simple rules. A variation in the spacing of a light beam emitted by a first light source from a light beam emitted by a second light source is consequently then only necessary to a slight extent, for example in order to correct production or manufacturing errors in the multibeam laser light source or construction errors, which in each case lead to deviations from a regular arrangement.

At this point, it should be noted generally that the feature of a variable spacing between the light beams emitted by a first and a second light source in the multibeam laser light source, a variable pitch spacing, can be used in at least two ways: Firstly, the variation in the pump energy distribution through the resonator can be performed for the calibration of the multibeam laser light source. The desired light beam spacing is set and the multibeam laser light source is then operated with the pump energy distribution required for this purpose. Secondly, it is also conceivable that an adjustable spacing is provided, i.e., the multibeam laser light source is operated in a first period, depending upon the purpose, with a first spacing between the light beams of a first and a second light source and, in a second period, is operated with a second spacing between the light beams of a first and a second light source. It is believed to be clear that both measures can also be taken in combination and result in advantageous possible uses due to the adjustable laser spacing.

In an advantageous embodiment, the multibeam laser light source has a control unit assigned thereto, which controls the timed driving of the laser light sources and/or the variation of the pump energy distributions in the resonators thereof.

The timed driving of the laser light sources can preferably also be carried out with a time delay in relation to one another. For this purpose, a delay device can be provided which, following the triggering of a first laser light source, effects the time-delayed triggering of all the other light sources of the plurality of light sources. The power supply to the multibeam laser light source can be provided by discrete electronics or by a microelectronic circuit which, optionally, can be integrated on the same holding element as the multibeam laser light source. Furthermore, provision can be made for a measuring device for the distribution of the light emitted by the first laser light source, at least in one of the two spatial directions at right angles to the optical axis, to be assigned at least to the first laser light source. Furthermore, automatic adjustment of the spacings between individual laser light sources to desired values, in particular by using the measured values from the measuring device for determining an actual value, can be provided. In an advantageous development of the invention, the output power of each laser light source can be stabilized by a closed control loop.

As already repeatedly mentioned hereinbefore, the multibeam light source according to the invention can advantageously be used in an image-setting or imaging device for an image carrier. Here, the image carrier can be in particular a printing form, a printing form precursor, which becomes a printing form as result of further process steps, or a film. In particular, it can be a printing form for offset printing. In a preferred embodiment, the image-setting or imaging device comprises imaging optics having micro-optical components. The individual components, in particular the micro-optical components, of the imaging optics can, in this regard, further be used to vary the propagation direction of the light or a light beam, for beam shaping or the like. In a further development of the invention, the light beams produced by the multibeam laser light source according to the invention are excited by a close-coupled microchip laser, the emitted radiation of which can be continuous or pulsed.

Due to the variable beam spacing of the light from the multibeam laser light source, it is advantageously possible to achieve variable spacing of the projection points of the laser light sources in the projection by reproducing or imaging optics onto a projection plane or projection surface. If the projection points are used to produce image points in an image-setting or imaging device according to the invention, there is implied a variable resolution, i.e., number of image points per unit length, of the image-setting or imaging device. In this case, in connection with the invention, it is unimportant whether adjacent image points are exposed simultaneously or, for example, are set at consecutive image-setting times within the context of a so-called interleaf process.

If, for setting an image on an image carrier which is moved relative to the image-setting device, which comprises a multibeam laser light source with light sources arranged in a one-dimensional array, delayed individual driving of the laser light sources is combined with a variation in the spacing of the light beams emitted by the individual laser light sources in the direction perpendicular to the relative movement between image-setting device and image carrier, it is possible to achieve a two-dimensional correction of the position of image points, by translation of the image point perpendicularly to the direction of the relative movement and by projection along the direction of the relative movement onto a one-dimensional curve.

An image-setting or imaging device according to the invention for an image carrier which is a printing form can be used with particular advantage in a printing form exposer or in a printing unit. A printing press according to the invention, which comprises a feeder, at least one printing unit and a delivery, is distinguished by the fact that the printing press has at least one printing unit with an image-setting or imaging device according to the invention. Here, the press can be a machine that processes sheet-like printing materials, which comprises at least one feeder, a printing unit and a delivery, or a web-processing machine, also additionally having a folder arranged downstream.

Other features which are considered as characteristic for the invention are set forth in the appended claims.

Although the invention is illustrated and described herein as embodied in a multibeam laser light source with variable laser light-source spacing for setting images on printing forms, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
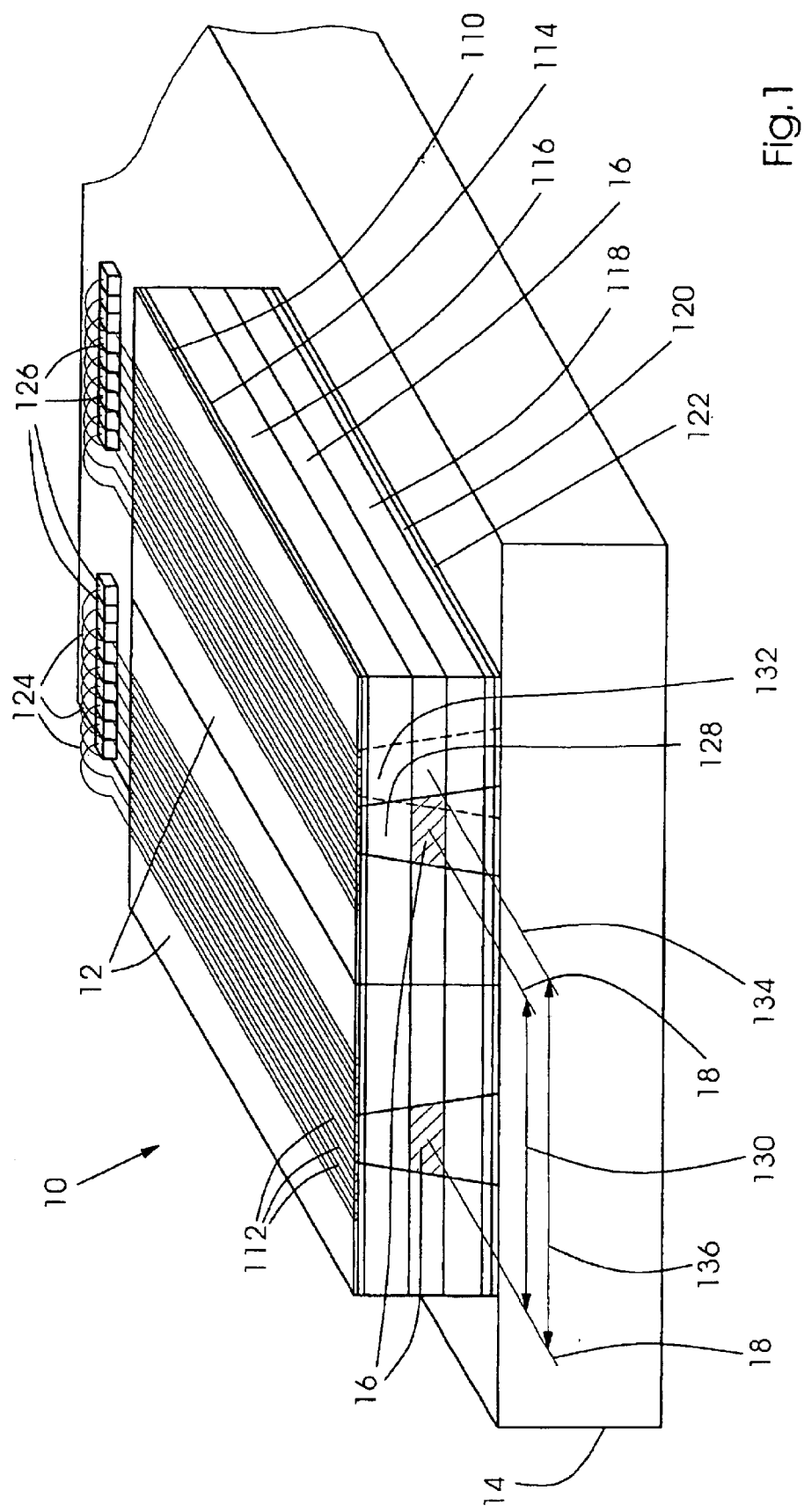
FIG. 1 is a fragmentary diagrammatic front, side and top perspective view of an embodiment of a multibeam laser light source according to the invention as an array of gain-guided laser diodes having a gain profile that is shiftable laterally in relation to the optical axes by a pump current offset.

Referring now to the drawings and, first, particularly to FIG. 1 thereof, there is shown therein diagrammatically an embodiment of the multibeam laser light source according to the invention as an array of gain-guided laser diodes, which have a profile that is shiftable laterally in relation to the optical axes by a pump current offset. In FIG. 1, the multibeam laser light source 10 comprises two laser light sources 12 by way of example. Without restriction, the multibeam laser light source can have a plurality or number n of laser light sources 12, n being a natural number, preferably a prime number. Typical pluralities of laser light sources lie between ten and a thousand, in particular between the natural numbers two hundred sixty and thirty. The multibeam laser light source 10 is shown on a holding element 14, for example a heat sink or a substrate, with a p-doped side at the top. It is also possible to produce a construction wherein the p-doped side is located at the bottom of the holding element 14. Active zones 16 of the laser activity in this view of the multibeam laser light source 10 emit along the optical axes 18 from the front surface of the laser light sources 12, which are pumped by current injection starting from the top. In this embodiment formed as gain-guided laser diodes of the multibeam laser light source 10 according to the invention, the semiconductor lasers have the following layer structure, by way of example: On the top there is an oxide layer 110, wherein preferably uniformly mutually spaced track-like contacts 112, for example having AuZn and being oriented at least approximately parallel to the optical axes of the laser light sources 12, are embedded. By way of example, nine contacts 112 per laser light source 12 are shown in FIG. 1. In general, the number of contacts 112 is a natural, preferably odd number. The contacts 112 represent conductive connections to a $p^+$-GaAs layer 114, so that injection of current into the semiconductor structure lying underneath is possible. In the embodiment shown by way of example in FIG. 1, the semiconductor structure comprises a p-AlGaAs layer 116, the active zone 16, preferably of GaAs, and an n-AlGaAs layer 118. Typical dimensions for this layer structure are 2.0 micrometers for the p-AlGaAs layer 116, 0.2 micrometers for the active zone 16 and 2.0 micrometers for the n-AlGaAs layer 118. The semiconductor structure comprises underneath an n-GaAs substrate 120, which is terminated by a grounded AuGe layer 122.

In this embodiment, the contacts 112 typically have a width of about one micrometer, and have a spacing of about one micrometer. They are provided with bonding wires 124, which lead to mutually insulated electric contacts 126. The variation in distribution of the current flow through the contacts 112 permits a change in the current injection and therefore in the pump energy distribution in the resonator of the semiconductor structure, as is explained hereinafter in greater detail. Current injection is performed by current flow through a selection of a number of contacts 112 which are adjacent. Depending upon the selection of the number of contacts 112 through which current flows, the pump energy distribution can consequently be changed, varied or shifted laterally, i.e., at least approximately perpendicularly to the optical axis 18 in a laser light source 12, and at least approximately perpendicularly to the electron current 128 through the semiconductor structure. By way of example, an electron current 128 is shown, respectively, in the first and in the second laser light source 12 in FIG. 1, the current being produced by a current flow through three contacts 112, symmetrically about the middle one. The pump energy distribution determines, respectively, the position of the optical axes 18, which have a mutual spacing 130. By way of example, in FIG. 1, an electron current 132 with a changed pump energy distribution in a laser light source 12 is likewise shown, as produced by current flow through three outer contacts 112. With an unchanged pump energy distribution in the other laser light source 12, there is a different mutual spacing 136 for this electron current 132 with a changed pump energy distribution.

As an alternative to making contact with all the contacts 112, as shown in FIG. 1, by bonding wires 124 which lead to mutually insulated electric contacts 126, it is also possible, in a calibration process of the multibeam laser light source 10, for only those contacts 112 which are required in subsequent operation with desired mutual spacings of the light beams and optical axes 18, respectively, to be linked by bonding wires 124 to an electric contact 126. For this purpose, initially only the middle one of the contacts 112 of each laser light source 12 is linked. For the purpose of adjustment, an optical system arranged downstream is then adjusted, and thereafter the pitch error of the multibeam laser light source 10 is measured, so that by comparing the actual position with a desired or nominal position, the necessary shifting of individual emitters can be determined, taking into account the imaging properties of the optical system arranged downstream. The shift or variation in the mutual spacing 130 between the laser light sources 12 can then be performed by severing already linked contacts 112 and connecting new contacts 112 in discrete steps, the width of which is determined by the width of the contacts and the spacings thereof from one another.

Figure 2:
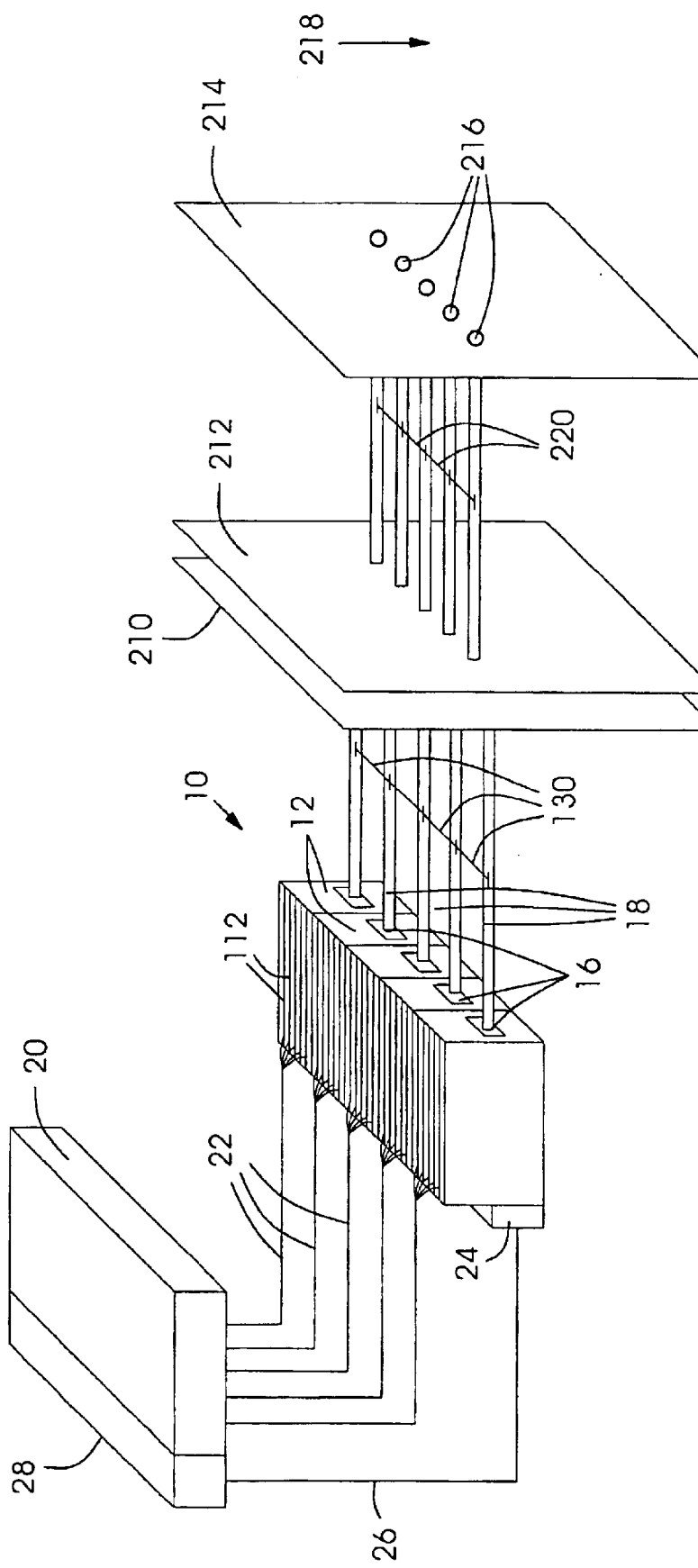
FIG. 2 is a front, side and top perspective schematic and diagrammatic view of a preferred embodiment of the image-setting or imaging device according to the invention with a multibeam laser light source according to the invention that emits light beams having variable spacings from one another.

FIG. 2 represents schematically and diagrammatically a preferred embodiment of the image-setting or imaging device according to the invention with a multibeam laser light source according to the invention which emits light beams having variable mutual spacings. The multibeam laser light source 10 comprises a number of individually drivable or controllable laser light sources 12, in particular gain-guided laser diodes. The individual laser light sources 12 lie on a one-dimensional array, i.e., at least approximately on a straight line. By way of example, five individual laser light sources 12 are shown in FIG. 2, however, in the general case, n laser light sources 12 are provided, n being a natural number, preferably a prime number. The light beams emitted by the active zones 16 of the light sources 12, along the optical axes 18, have a mutual spacing 130 which can be varied or changed as a function of the driving or control of the contacts 112, which here are five in number per laser light source 12 as an example, in accordance with the procedure already described hereinbefore in detail with respect to FIG. 1. The light sources are reproduced or imaged onto projection points 216 in a projection plane 214 by imaging optics, which are represented in FIG. 2 by a first main plane 210 and a second main plane 212. Located in the projection plane 214 is the image carrier, which can be moved in the movement direction 218 relative to the image-setting or imaging device and to the projection points 216. The spacing 220 between respective pairs of the projection points 216 is greater than, equal to or less than the spacing 130 between the beams emerging from the laser light sources 12, depending upon the optical properties, in particular the projection ratio, of the imaging optics.

The individual laser light sources 12 in the multibeam laser light source 10 of the image-setting or imaging device can be used in continuous laser operation. This also includes operation in time intervals wherein the individual laser light sources 12 are switched on and off again. Expressed in other words, in order to produce individual packets of light, the laser emission is appropriately suppressed or interrupted for a specific time interval. Because the image carrier located in the projection plane 214 is moved with a speed component relative to the projection points 216 at least tangentially to the surface of the image carrier, the image points from the light sources 12 set by the projection points 216, when the light sources 12 are triggered, i.e., switched on and off again after a specific time interval, lie at different coordinate positions on the surface of the print carrier.

The image optics represented by the first main plane 210 and the second main plane 212 can both have reflecting, transmitting, refractive or similar optical components. These are preferably micro-optical components, i.e., components which influence the light emitted by an individual laser light source 12, while the light from the other individual laser light sources 12 remains unaffected by these components. In particular, the imaging optics can have imaging scales which are both enlarging and diminishing and are also different in the two directions parallel to and perpendicular to the active zones 16 of the laser light sources 12, which is in particular advantageous for the correction of divergences and/or aberrations. The physical and/or chemical properties of the surface of the image carrier are changed by the laser radiation, so that, as a result of the exposure with a specific intensity and during a specific time interval, image information for an image point is written.

In a preferred embodiment, the image-setting or imaging module 10 is on a cooling element, for example a copper heat sink with cooling water flow. The image-setting or imaging module 10 is connected to a drive or control device by a line for power supply and control. The drive or control device has individual components with which it is possible to control or regulate the individual light sources 12 of the array separately from one another. The cooling element is connected to the temperature control system by a line for controlling the cooling element.

The embodiment of the image-setting or imaging device according to the invention, which is shown in FIG. 2, comprises a control unit 20, to which the individually drivable laser light sources 12 are connected by pump current lines 22, combined for one laser light source 12, respectively. In this embodiment, provision is made for the driving or control of the individual contacts 112 of each laser light source 12 to permit a change and shift, respectively, of the pump energy distribution in each laser light source 12. Furthermore, each laser light source 12 of the embodiment shown in FIG. 2 of the image-setting or imaging device according to the invention has a measuring device for determining the distribution of the light emitted by the assigned laser light source 12 in the direction of the orientation of the one-dimensional array and perpendicularly to the optical axis 18. By a line 26, the measuring devices 24 are connected to a measured value processing unit 28, so that the information about the position of the emitted light is available to the control unit 20. For example, automatic shifting of the current injection into the laser light source 12 from an actual value determined by measurement to a nominal or desired value can be performed in a control loop.

As an option, the control unit 20 can moreover comprise a delay device, with which time-delayed triggering of individual laser light sources 12 is carried out. In this regard, the delay device preferably comprises a programmable logic or an ASIC, i.e., an application-specific integrated circuit. As a first laser light source 12 is switched on and switched off, respectively, a counting device with counter starting values for every other laser light source 12 in the multibeam laser light source 10 is started. Provision can be made for the image-setting or imaging data for individual laser light sources 12, at least for common triggering of the array, to be stored in a memory in the delay device. For each laser light source 12, the counting device counts down from the starting value to zero. When the zero value is reached, the assigned laser light source 12 is switched on and the transfer of the appropriate data to this emitter is triggered.

Figure 3:
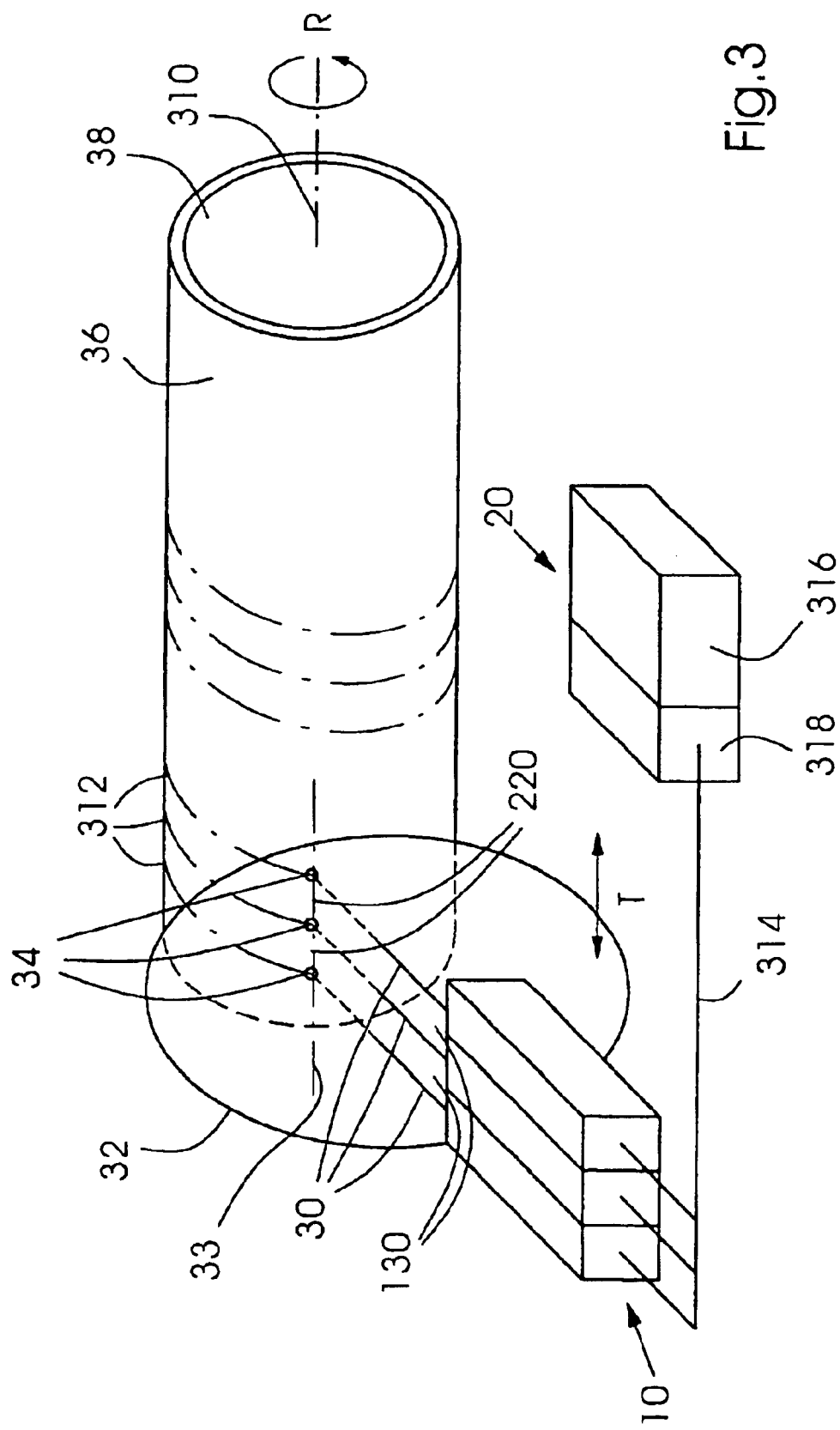
FIG. 3 is a front, side and top perspective view of an embodiment of the image-setting or imaging device according to the invention with a multibeam laser light source according to the invention for emitting light beams having variable spacings from one another, and a longitudinal and end perspective view of a rotatable printing form cylinder carrying a printing form whereon an image is set by the image-setting or imaging device.

FIG. 3 shows an embodiment of the image-setting or imaging device according to the invention with a multibeam laser light source according to the invention which emits light beams having mutual spacings which are variable in order to set an image on a printing form that is accommodated on a rotatable printing form cylinder. An embodiment of this type can be realized, for example, in a printing form exposer or a so-called direct-imaging printing unit of a printing press.

By way of example, in this embodiment, the multibeam laser light source 10 of the image-setting or imaging device has three laser light sources 12 arranged on an at least approximately straight line, so that three image-setting or imaging beams 30 are produced which, by the imaging optics 32, are reproduced or imaged in a projection line 33 on three projection points 34 on the printing form 36. The printing form 36 is accommodated or held on a printing form cylinder 38, which can be rotated about the rotational axis 310 thereof. This rotation is represented by the arrow R in the rotational direction R. The embodiment shown in FIG. 3 illustrates the important case wherein the projection line 33 runs at least approximately parallel to the rotational axis 310 of the printing form cylinder 38. Provision is made for non-illustrated linear actuators here, so that the image-setting or imaging device with the multibeam laser light source 10 and the imaging optics 32 can be moved at least approximately parallel to the rotational axis 310 of the printing form cylinder on an at least approximately linear path, which is identified by the double-headed arrow in the translatory direction T.

For continuous image-setting or imaging, i.e., producing a two-dimensional pattern of image points on the two-dimensional surface of the printing form 36, the printing form cylinder 38 rotates in accordance with the rotational movement R, and the image-setting or imaging device with the multibeam laser light source 10 and the imaging optics 32 is translated along the printing form cylinder 38 in accordance with the translatory direction T, at least approximately parallel to the rotational axis 310. Image-setting or imaging results, which revolves on a helical path around the rotational axis 310 of the printing form cylinder 38. The path of the projection points 34 and of the image points set by the latter, respectively, are indicated by the lines 312. In other words: after the setting of an image of or imaging three image points by way of example here, a relative displacement of printing form 36 and projection points 34 with a vector component perpendicularly to the direction defined by the projection line 33 is carried out to a specific extent, so that three points, for example, are written again at a different position of the printing form 36. So-called raster scan lines of image points are thus produced. The multibeam laser light source 10 of the image-setting or imaging device is provided with a connection 314 to a control unit 20. In this embodiment, the control unit 20 comprises a delay device 316 and a drive or control device 318.

With the use of the multibeam laser light source 10 according to the invention in an image-setting or imaging device as shown in FIG. 3, it is possible to correct a pitch error of the laser light sources, regardless of the cause thereof by production or construction errors, by having the possibility of shifting the position of individual projection points for producing image points 220, parallel to the rotational axis 310 of the printing form cylinder 38. In the circumferential direction, a position correction can be carried out by delayed driving or controlling of the partial laser light sources 12 of the multibeam laser light source 10.

It should further be noted that in the case of semiconductor lasers, the production of the contacts, in particular the shaping thereof, is subject to restrictions as a result of the lithographic processes used to produce the laser structure. Furthermore, there are physical processes, such as induction effects and electric crosstalk, which determine the minimum possible spacing between the individual contacts. With the known lithographic techniques available today, it is possible to produce structures in the sub-micrometer range, even the nanometer range, so that the listed limiting conditions do not have any negative effect upon the use of the invention in particular in image-setting or imaging devices for printing forms having high resolution of image points (a large number of image points in a predefined or prescribed linear interval).

I claim:

1. A multibeam laser light source, comprising: a plurality of individual laser light sources arranged in an array and including a first and a second laser light source for emitting respective light beams spaced from one another, said first laser light source having a resonator with a given pump energy distribution therethrough, the spacing of an optical axis of the light beam emitted by said first laser light source from an optical axis of the light beam emitted by said second laser light source being variable by varying said given pump energy distribution through said resonator of said first laser light source.

2. The multibeam laser light source according to claim 1, wherein the variation in said pump energy distribution is performable in at least one of two Cartesian spatial directions, at least approximately perpendicularly to an optical axis of said resonator.

3. The multibeam laser light source according to claim 1, wherein said individual laser light sources are individually controllable.

4. The multibeam laser light source according to claim 1, wherein said individual laser light sources are semiconductor lasers.

5. The multibeam laser light source according to claim 4, wherein said semiconductor lasers are gain-guided laser diodes.

6. The multibeam laser light source according to claim 5, wherein said individual laser light sources are located on a laser diode bar.

7. The multibeam laser light source according to claim 4, wherein at least said first laser light source has a plurality of mutually insulated contacts for injecting current into said resonator.

8. The multibeam laser light source according to claim 7, wherein said mutually insulated contacts are tracks extending at least approximately parallel to an optical axis of said resonator.

9. The multibeam laser light source according to claim 8, wherein said mutually insulated contacts have an at least approximately uniform spacing from one another.

10. The multibeam laser light source according to claim 4, wherein said individual laser light sources are arranged on a substrate.

11. The multibeam laser light source according to claim 1, wherein said individual laser light sources are arranged in an array selected from the group thereof consisting of an at least approximately uniform and an at least approximately Cartesian array.

12. The multibeam laser light source according to claim 1, wherein said individual laser light sources are arranged at least approximately on a line.

13. The multibeam laser light source according to claim 12, wherein said individual laser light sources are arranged at least on an approximately straight line.

14. The multibeam laser light source according to claim 1, further having a control unit assigned thereto, said control unit serving for controlling at least one of timed driving of said individual laser light sources and variation of pump energy distributions in the resonators of the respective individual laser light sources.

15. The multibeam laser light source according to claim 1, further comprising a measuring device allocated to at least said first laser light source for measuring a distribution of the light emitted by said first laser light source, at least in one of two spatial directions perpendicular to an optical axis of said resonator.

16. In an image-setting or imaging device for an image carrier including a multibeam laser light source, the multibeam laser light source comprising:

a plurality of individual laser light sources arranged in an array and including a first and a second laser light source for emitting respective light beams spaced from one another, said first laser light source having a resonator with a given pump energy distribution therethrough, the spacing of an optical axis of the light beam emitted by said first laser light source from an optical axis of the light beam emitted by said second laser light source being variable by varying said given pump energy distribution through said resonator of said first laser light source.

17. An image-setting or imaging device for an image carrier including a multibeam laser light source and imaging optics having micro-optical components, the multibeam laser light source comprising:

a plurality of individual laser light sources arranged in an array and including a first and a second laser light source for emitting respective light beams spaced from one another, said first laser light source having a resonator with a given pump energy distribution therethrough, the spacing of an optical axis of the light beam emitted by said first laser light source from an optical axis of the light beam emitted by said second laser light source being variable by varying said given pump energy distribution through said resonator of said first laser light source.

18. In a printing form exposer including an image-setting or imaging device for an image carrier having a multibeam laser light source, the multibeam laser light source comprising:

a plurality of individual laser light sources arranged in an array and including a first and a second laser light source for emitting respective light beams spaced from one another, said first laser light source having a resonator with a given pump energy distribution therethrough, the spacing of an optical axis of the light beam emitted by said first laser light source from an optical axis of the light beam emitted by said second laser light source being variable by varying said given pump energy distribution through said resonator of said first laser light source.

19. In a printing unit including an image-setting or imaging device for an image carrier having a multibeam laser light source, the multibeam laser light source comprising:

a plurality of individual laser light sources arranged in an array and including a first and a second laser light source for emitting respective light beams spaced from one another, said first laser light source having a resonator with a given pump energy distribution therethrough, the spacing of an optical axis of the light beam emitted by said first laser light source from an optical axis of the light beam emitted by said second laser light source being variable by varying said given pump energy distribution through said resonator of said first laser light source.

20. In a printing press provided with a printing unit, the printing unit including an image-setting or imaging device for an image carrier having a multibeam laser light source, the multibeam laser light source comprising:

a plurality of individual laser light sources arranged in an array and including a first and a second laser light source for emitting respective light beams spaced from one another, said first laser light source having a resonator with a given pump energy distribution therethrough, the spacing of an optical axis of the light beam emitted by said first laser light source from an optical axis of the light beam emitted by said second laser light source being variable by varying said given pump energy distribution through said resonator of said first laser light source.

* * * * *